(12) United States Patent
Maguire et al.

(10) Patent No.: US 6,380,939 B2
(45) Date of Patent: *Apr. 30, 2002

(54) METHOD AND APPARATUS FOR PROVIDING SINGLE BUTTON ACCESS TO OSCILLOSCOPE DELAY AND TRIGGER CENTRIC HORIZONTAL DISPLAY MODES

(75) Inventors: David P. Maguire; Kenneth P. Dobyns, both of Beaverton, OR (US)

(73) Assignee: Tektronix, Inc., Beaverton, OR (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/106,386

(22) Filed: Jun. 25, 1998

(51) Int. Cl.[7] .................................................. G09G 5/36
(52) U.S. Cl. .................. 345/440.1; 345/440; 324/121 R
(58) Field of Search ............................... 345/133, 134, 345/440, 440.1, 441, 442; 324/121 R

(56) References Cited

U.S. PATENT DOCUMENTS

| | | | | |
|---|---|---|---|---|
| 5,444,459 A | * | 8/1995 | Moriyasu | 345/134 |
| 5,530,454 A | * | 6/1996 | Etheridge et al. | 345/134 |
| 5,706,203 A | * | 1/1998 | Kawauchi | 345/134 |
| 5,949,399 A | * | 9/1999 | Kreft et al. | 345/134 |
| 5,986,637 A | * | 11/1999 | Etheridge et al. | 345/134 |
| 5,999,163 A | * | 12/1999 | Ivers et al. | 345/134 |

* cited by examiner

*Primary Examiner*—Richard Hjerpe
*Assistant Examiner*—Kimnhung Nguyen
(74) *Attorney, Agent, or Firm*—David N. Caracappa; Thomas F. Lenihan

(57) ABSTRACT

A system for displaying waveforms representing an input signal includes a display subsystem, coupled to a source of the input signal, for displaying a waveform representing the input signal in response to a display control signal. A trigger circuit is coupled to the input signal source and detects a trigger event. A time displacement circuit is coupled to the trigger circuit and generates a time displaced trigger signal a controllable amount of time after detection of the trigger event. A switch is coupled between the trigger circuit, the time displacement circuit, and the display subsystem. The switch selectively generates a display control signal in response to either the detected trigger event or a time displaced trigger signal.

3 Claims, 2 Drawing Sheets

METHOD AND APPARATUS FOR PROVIDING SINGLE BUTTON ACCESS TO OSCILLOSCOPE DELAY AND TRIGGER CENTRIC HORIZONTAL DISPLAY MODES

FIELD OF THE INVENTION

The present invention relates to user controls for an oscilloscope, and in particular to control of horizontal display modes in an oscilloscope.

BACKGROUND OF THE INVENTION

Earlier analog oscilloscopes included a trigger circuit which analyzed an acquired input signal for a user selected event, e.g. a negative-going or positive-going transition at a user selected voltage level, and in a specified channel if the oscilloscope was a multichannel oscilloscope. When the trigger event occurred, a waveform representing the acquired input signal occurring from that point forward in time was displayed on the display screen of the oscilloscope. The trigger point was displayed as the leftmost point in the displayed waveform. The timing of the displayed waveform was controlled by the user, and could be changed. As the timing changed, the time (horizontal) magnification of the waveform also changed. The change was made relative to the trigger point, which remained fixed at the leftmost point of the displayed waveform.

FIG. 1 is a combined waveform and oscilloscope display diagram illustrating the trigger and horizontal magnification characteristics of an analog oscilloscope. In FIG. 1, a waveform 10 represents e.g. the voltage of an acquired input signal supplied to the oscilloscope via an oscilloscope probe. A user has set the trigger to the illustrated trigger point 12 in a known manner. A first display 11 is a waveform display on the display screen of the oscilloscope in which the time base is set to display the waveform 10 from the trigger point 12 to the point 14. A second display 13 is a waveform display on the display screen of the oscilloscope in which the trigger point is the same as that in the first display 11, but the time base has been adjusted to display the waveform 10 from the trigger point 12 to the point 16.

It is apparent from FIG. 1 that the trigger point 12 is displayed in the waveform display, regardless of the setting of the time base, and that the trigger point 12 is always displayed as the leftmost point of the waveform display. Furthermore, it is apparent that the displayed waveform is magnified from the trigger point 12 on. That is, the trigger point is co-located with the magnification point. Consequently, the waveform display may be magnified horizontally to any desired degree without losing the display of the trigger point 12.

As digital oscilloscopes were developed, it became possible to display portions of the waveform occurring before the trigger point, as well as after. The trigger could be set by a user in the same manner as in analog oscilloscopes. However, instead of displaying the trigger point as the leftmost point in the displayed waveform. The trigger point could be displayed at any point in the displayed waveform. Also as with analog oscilloscopes, the timing of the displayed waveform was controlled by the user, and could be changed, thus changing the time (horizontal) magnification of the waveform. Again, as with analog oscilloscopes, the change was made relative to the trigger point, but in digital oscilloscopes, the trigger point was not constrained to be the leftmost point in the displayed waveform.

FIG. 2 is a combined waveform and oscilloscope display diagram illustrating the trigger and horizontal magnification characteristics of a digital oscilloscope. In FIG. 2, again a waveform 10 represents e.g. the voltage of an input signal supplied to an oscilloscope via an oscilloscope probe. A user has set the trigger to the illustrated trigger point 12' in a known manner. This trigger point 12' is different than that set in FIG. 1, however. A first display 21 is a waveform display on the display screen of the oscilloscope in which the time base is set to display the waveform 10 from the point 22 to the point 24, and includes the trigger point 12' within the displayed waveform. A second display 23 is a waveform display on the display screen of the oscilloscope in which the trigger point 12' is displayed in the same position as that in the first display 21, but the time base has been adjusted to display the waveform 10 from the point 26 to the point 28.

It is apparent from FIG. 2 that, as in FIG. 1, the trigger point 12' is displayed in the waveform display, regardless of the setting of the time base. However, in FIG. 2, the trigger point 12' is displayed within the waveform display, not at the leftmost edge, as in FIG. 1. It is also apparent that, as in FIG. 1, the magnified signal in display 23 is magnified about the location of the trigger point 12'. Thus, the trigger point is co-located with the magnification point. That is, the trigger point remains in the same place in the waveform display, while the displayed waveform expands or contracts around that point as the time base is changed by the user. Consequently, the waveform display may still be magnified horizontally to any desired degree without losing the display of the trigger point.

Other digital oscilloscopes used a different technique for triggering the waveform display, termed a viewport technique. In such a digital oscilloscope, the displayed waveform is displaced by some user controlled amount of time from the trigger point. This display is termed a viewport. The displayed waveform in the viewport does not, necessarily, contain the trigger point. The magnification of the displayed waveform takes place within the viewport and the displayed waveform expands and contracts around a magnification point, which may be any point on the display screen, such as the leftmost point of the viewport. In a preferred embodiment, however, the magnification point is the center point of the display screen.

FIG. 3 is a combined waveform and oscilloscope display diagram illustrating the trigger and horizontal magnification characteristics of a digital oscilloscope. In FIG. 3, again a waveform 10 represents e.g. the voltage of an input signal supplied to an oscilloscope via an oscilloscope probe. A user has set the trigger to the illustrated trigger point 12 in a known manner. This trigger point 12 is the same that set in FIG. 1. In FIG. 3, a user has set a time displacement to point 32 of the input signal. This is a point after the trigger point, and is referred to as a positive time displacement. It is also possible for a user to specify a negative time displacement to a point before the trigger point. A first display 31 is a waveform display on the display screen of the oscilloscope in which the time base is set to display the waveform 10 starting from the time displacement point 32 to the point 34. The center point of the display screen corresponds to point 35 of the waveform 10. A second display 33 is a waveform display on the display screen of the oscilloscope in which the time base has been adjusted to display the waveform 10 from the point 36 to the point 38. The center point of the display screen continues to correspond to point 35 of the waveform 10. The point 35, thus, is the magnification point.

It is apparent from FIG. 3 that the trigger point 12 is not necessarily displayed in the waveform display, depending upon the settings of the time displacement and the time base. Also, in FIG. 3, the magnified signal in display 33 is magnified about the center point of the waveform display. Thus, in FIG. 3, the trigger point 12 is not co-located with the magnification point 35. Instead, the displayed waveform expands or contracts around the magnification point 35, which corresponds to the display screen center point, as the time base is changed by the user.

One skilled in the art will understand that more sophisticated triggering techniques exist. For example, there may be what is termed a main trigger, which analyzes an acquired input signal for a user specified main trigger event, and a secondary, or delayed trigger. These operate in the following manner: after the main trigger detects the main trigger event, the secondary trigger analyzes the acquired input signal for a user specified secondary or delayed trigger event. This secondary trigger event then initiates the waveform display. The oscilloscope may be controlled to display the waveform after, or surrounding, the main trigger event; or after, or surrounding, the secondary or delayed trigger event.

Alternatively, the oscilloscope may include what is termed an A and a B trigger. The A trigger may be set by the user in the known manner, e.g. a positive going or negative going signal through a user set voltage level on a selected channel. The B trigger may be similarly set. The combination of the A trigger and the B trigger initiates the waveform display. Either or both of the A and B triggers may also have a time displacement associated with them. Additional such triggers are also possible, e.g. C trigger, D trigger, etc. In any case, using the waveform display techniques illustrated in FIG. 1 or 2, the displayed waveform contains the trigger event, and the magnification occurs around the display point representing the time of that event. Using the waveform display technique illustrated in FIG. 3, the trigger point is not necessarily contained in the displayed waveform, and the displayed waveform is time magnified about the magnification point, which is the center point of the display screen in a preferred embodiment.

The trigger-centric techniques of FIGS. 1 and 2 are useful for a user to observe phenomena surrounding the trigger point because, regardless of the time magnification, the trigger point is never removed from the waveform display. For example, in manufacturing or production environments, in which signals containing trigger events can be reliably and accurately supplied to and detected by the oscilloscope, the trigger-centric technique allows observation of a signal near such trigger points. On the other hand, the viewport technique of FIG. 3 is useful to observe phenomena located at some time distance from the trigger point. For example, a location in the middle of a pulse train can be easily observed by adjusting the trigger to detect the start of the pulse train, and adjusting the time displacement to the location of interest in the middle of the pulse train.

In existing oscilloscopes, to switch from a trigger-centric waveform display to a viewport waveform display requires resetting of trigger controls on the oscilloscopes, which can involve properly setting several switches and making appropriate adjustments to user controls for trigger voltage levels and time displacements for each trigger. It is desirable to provide a simple and fast way for a user to switch between the trigger-centric and the viewport modes of operation so that the user can observe the acquired input waveform both in the location of the trigger to ensure it is operating reliably and accurately, and easily switch to observe the acquired input waveform in the time location of the delayed phenomenon.

SUMMARY OF THE INVENTION

In accordance with principles of the present invention, a system for displaying waveforms representing an input signal includes a display subsystem, coupled to a source of the input signal, for displaying a waveform representing the input signal in response to a display control signal. A trigger circuit is coupled to the input signal source and detects a trigger event. A time displacement circuit is coupled to the trigger circuit and generates a time displaced trigger signal a controllable amount of time after detection of the trigger event. A switch is coupled between the trigger circuit, the time displacement circuit, and the display subsystem. The switch selectively generates the display control signal in response to either the detected trigger event or the time displaced trigger event.

DETAILED DESCRIPTION

Figure 1:
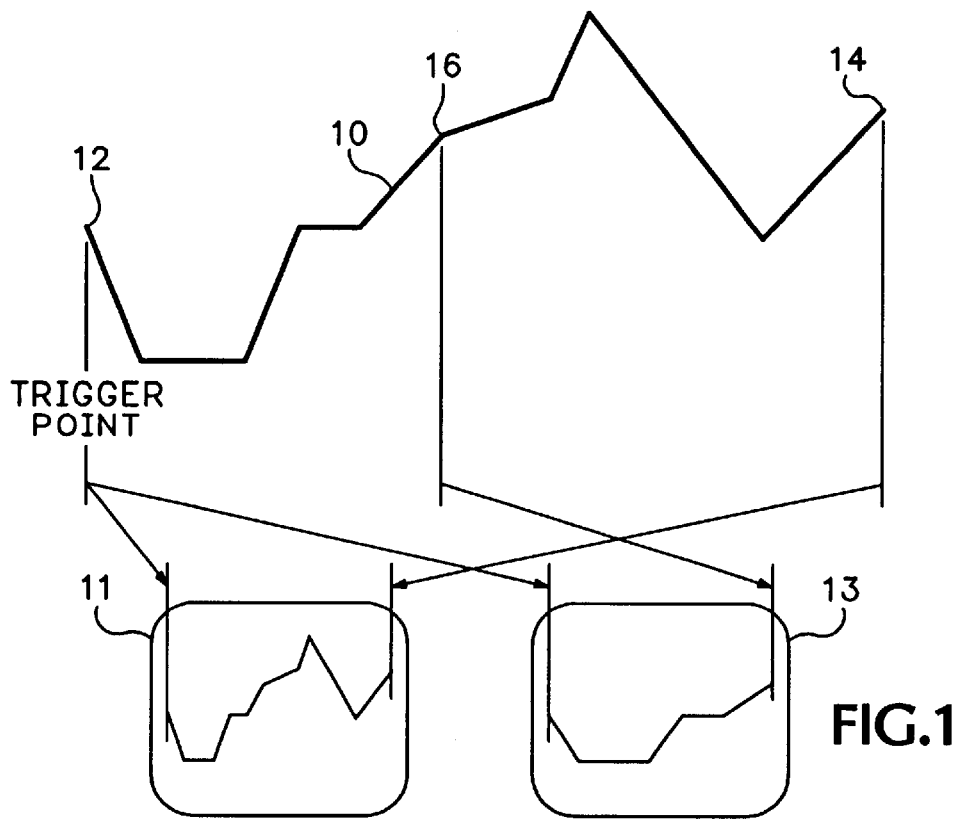
FIG. 1 is a combined waveform and oscilloscope display diagram illustrating the trigger and horizontal magnification characteristics of an analog oscilloscope.
Figure 2:
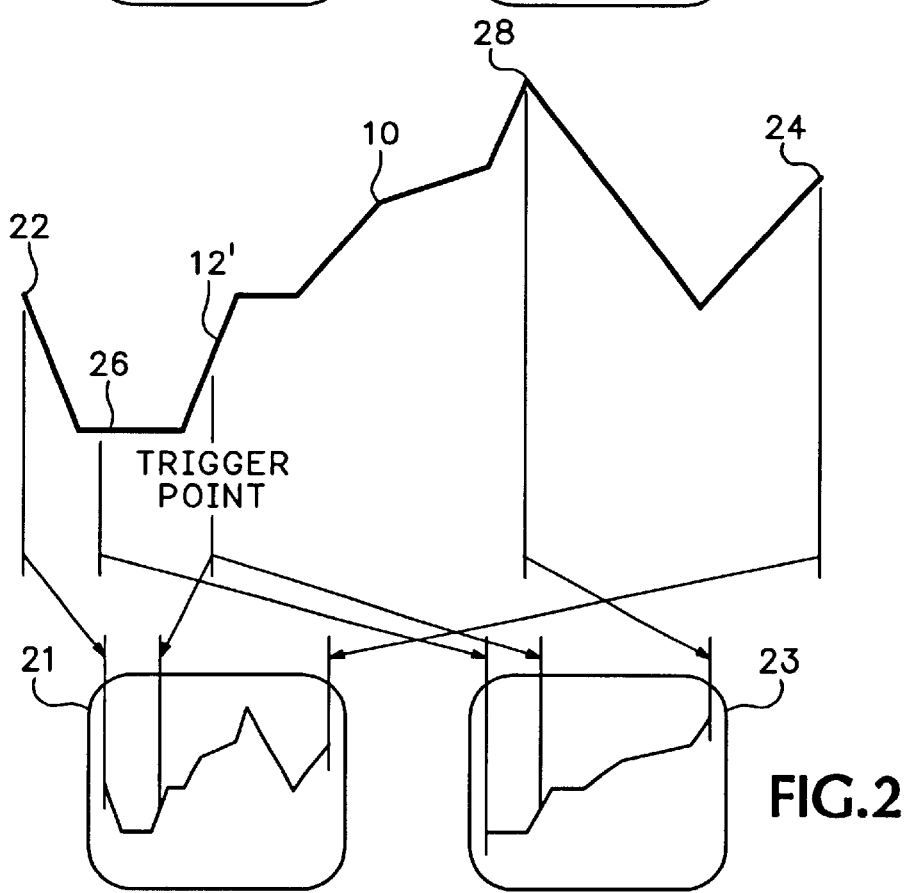
FIGS. 2 and 3 are combined waveform and oscilloscope display diagrams illustrating the trigger and horizontal magnification characteristics of a digital oscilloscope.
Figure 3:
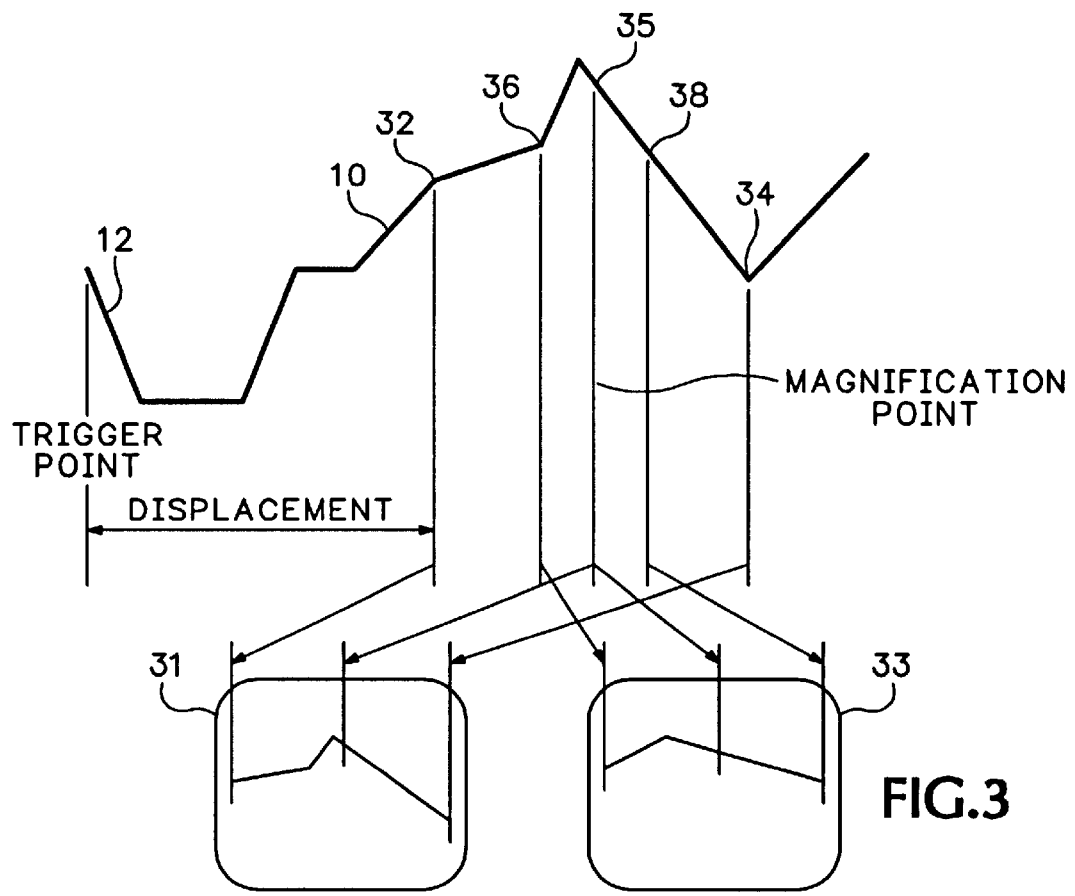
Figure 4:
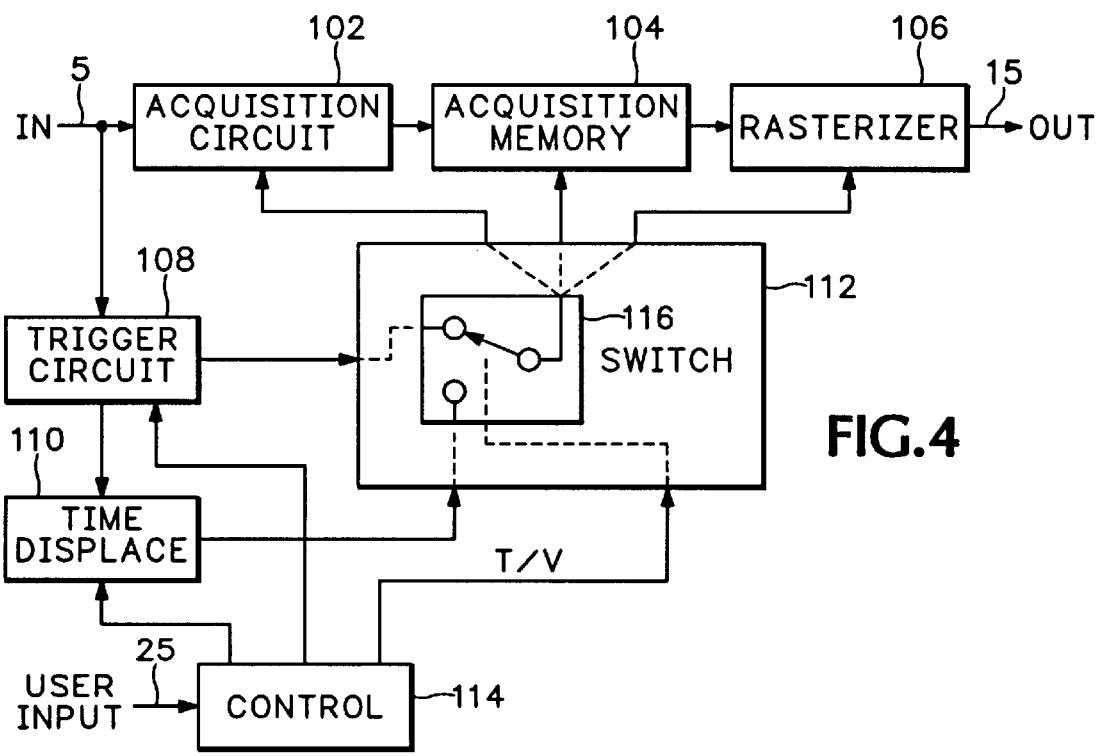
FIG. 4 is a block diagram of a portion of a digital oscilloscope in accordance with the present invention.

FIG. 4 is a block diagram of a portion of a digital oscilloscope in accordance with the present invention. FIG. 4 illustrates only those elements necessary to understand the design and operation of the present invention. One skilled in the art will understand that other elements are necessary in a digital oscilloscope, and will understand what those elements are, and how they are interconnected with the elements illustrated in FIG. 4.

In FIG. 4, an input terminal 5 is coupled to a source (not shown) of an input signal. For example, input terminal 5 may be an oscilloscope probe. Input terminal 5 is coupled to respective input terminals of an acquisition circuit 102 and a trigger circuit 108. An output terminal of the acquisition circuit 102 is coupled to an input terminal of an acquisition memory 104. An output terminal of the acquisition memory 104 is coupled to an input terminal of a rasterizer 106. An output terminal of the rasterizer 106 is coupled to an output terminal 15. Output terminal 15 produces a signal representing a raster displaying the acquired input signal, and is coupled to utilization circuitry (not shown). The utilization circuitry receives the raster representative signal from output terminal 15, and generates an image on a display device, such as the oscilloscope display screen, of the waveform display, as represented by the raster, all in a known manner.

A first output terminal of the trigger circuit 108 is coupled to a first input terminal of a switch circuit 112, and a second output terminal of the trigger circuit 108 is coupled to an input terminal of a time displacement circuit 110. An output terminal of the time displacement circuit 110 is coupled to a second input terminal of the switch circuit 112. Respective output terminals of the switch circuit 112 are coupled to corresponding control input terminals of the acquisition circuit 102, the acquisition memory 104 and the rasterizer 106.

A user input terminal 25 is coupled to a source (not shown) of user oscilloscope control inputs. For example, the user input terminal 25 may be coupled to receive signals indicating the positions of various switches, and settings for variable controls, such as dials, which are placed on the control panel of the oscilloscope. The user input terminal 25 is coupled to an input terminal of a control circuit 114. Respective output terminals of the control circuit 114 are coupled to corresponding control input terminals of the time displacement circuit 110, the trigger circuit 108 and the switch circuit 112.

One skilled in the art will understand that the various user controls described above could be incorporated directly into the circuit being controlled, e.g. trigger circuit 108, time displacement circuit 110 and/or switch circuit 112, instead of passing through the control circuit 114. Specifically, the switch circuit 112 could be implemented as a user controllable, physical, single pole double throw (SPDT) switch 116 having a pole (movable contact) coupled to the respective control input terminals of the acquisition circuit 102, the acquisition memory 104 and the rasterizer 106. A first throw (non movable contact) of the SPDT switch 116 is coupled to the output terminal of the trigger circuit 108 and a second throw of the SPDT switch 116 is coupled to the output terminal of the time displacement circuit 110, all as illustrated in phantom in FIG. 4. In a preferred embodiment, however, this switch is an electronic switch controlled by a signal from the control circuit 114, also as illustrated in phantom in FIG. 4.

In operation, the acquisition circuit 102 operates to reproduce an exact replica of the input signal at the input terminal 5, and then convert this signal to a series of multi-bit digital samples representing the input signal. This series of samples is stored in the acquisition memory 104. The rasterizer 106 retrieves these samples from the acquisition memory 104 and generates a raster representative signal at output terminal 15. This raster, when displayed by the utilization circuitry (not shown), produces an image of the waveform of the acquired input signal on the oscilloscope display screen, all in a known manner.

The control circuit 114 receives user control inputs through the user input terminal 25. Among other things, these user control inputs select the trigger event criteria and (if necessary) the location of the trigger point within the displayed waveform, or the time displacement of the waveform display from the trigger point. Control signals representing these user control inputs are supplied to the trigger circuit 108 and the time displacement circuit 110. These control signals condition the trigger circuit 108 and time displacement circuit 110 to operate in the manner specified by the user to set the trigger event criteria, trigger point location and time displacement, all in a known manner.

The display of the waveform by the acquisition circuit 102, the acquisition memory 104 and the rasterizer 106 is controlled by display control signals from the switch circuit 112. These display control signals control, among other things, which part of the input signal is acquired, rasterized and displayed. These control signals, in turn, are derived from either the trigger circuit 108 for trigger-centric waveform displays, or from the time displacement circuit 110 for viewport waveform displays.

In a first mode of operation, the trigger-centric mode, the switch 116 in the switch circuit 112 is in a first position as illustrated in FIG. 4. In addition, a user controllable dial on the oscilloscope control panel is set by the user to specify the location within the displayed waveform at which the trigger point is to be displayed. In a preferred embodiment, this dial is calibrated from 0 to 100, in which 0 represents the left hand edge of the displayed waveform and 100 represents the right hand edge of the displayed waveform. In this case, the trigger circuit 108 analyzes the input signal from input terminal 5 and detects the trigger event according to the criteria specified by the user as described above. When the trigger event is detected, a trigger signal is generated by the trigger circuit 108. The trigger signal from the trigger circuit 108 is used to generate a display control signal, which is coupled to the control input terminals of the acquisition circuit 102, the acquisition memory 104 and the rasterizer 106 through the switch circuit 112.

In a second mode of operation, the viewport mode, the switch 116 in the switch circuit 112 is in a second position, in which the time displacement circuit 110 is coupled to the respective output terminals of the switch circuit 112, opposite to that illustrated in FIG. 4. The same user controllable dial on the oscilloscope control panel used in the first, trigger-centric, mode of operation to set the trigger point location in the displayed waveform, is set by the user to specify the positive or negative time displacement from the trigger point to the displacement point. In this case, the trigger circuit 108 analyzes the input signal from the input terminal 5 and detects the trigger event according to the criteria specified by the user, as described above. This trigger signal from the trigger circuit 108 is supplied to the time displacement circuit 110. The time displacement circuit 110 provides a time displaced trigger signal, displaced by a positive (delay) or negative (advanced) time period as specified by the user. The time displaced trigger signal from the time displacement circuit 110 is used to generate a display control signal, which is coupled to the acquisition circuit 102, the acquisition memory 104 and the rasterizer 106. Thus, a single switch, used in conjunction with a single user controlled dial, can allow a user to easily switch between the trigger-centric mode and the viewport mode.

One skilled in the art will understand that several display control signals may simultaneously need to be switched between the trigger circuit 108 and the time displacement circuit 110. Several electronically controlled switches, such as switch 116 illustrated in FIG. 4, one for each such signal, may be included in the switch circuit 112, all controlled by the same control signal from the control circuit 114. In this case, a single switch on the oscilloscope control panel is coupled to the control circuit 114 through user input terminal 25. The control circuit 114 generates a trigger-centric/ viewport (T/V) control signal. The T/V control signal simultaneously controls all of the electronically controlled switches in the switch circuit 112.

An oscilloscope as illustrated in FIG. 4 can provide simple switching between the trigger-centric waveform viewing mode, in which the waveform in the vicinity of the trigger point can be observed, and the viewport waveform viewing mode, in which the waveform at some time displacement from the trigger point can be observed. This switching between these operating modes can be provided through the operation of a single switch on the oscilloscope control panel. In addition, a single user controlled dial on the oscilloscope control panel can control both the location of the trigger point within the displayed waveform when the switch is in the 'trigger-centric' position, and the time displacement of the displayed waveform when the switch is in the 'viewport' position.

What is claimed is:

1. A system for displaying waveforms representing an input signal, comprising:
   a display subsystem, coupled to a source of the input signal, for displaying a waveform representing the input signal in response to a display control signal;
   a trigger circuit, coupled to the input signal source, for generating a trigger signal upon detecting a trigger event;

a time displacement circuit, coupled to the trigger circuit, for generating a time displaced trigger signal displaced an amount of time from the trigger signal;

a switch, having a first input coupled to the trigger circuit, and a second input coupled to an input of the display subsystem, for selectively generating the display control signal in response to one of the trigger signal and the time displaced trigger signal, said switch being controlled in response to a switch control signal; and a controller for generating said switch control signal in respone to an input by a user; said controller also controlling said disply subsystem to magnify said waveform in response to a second input by said user, said controller selectively causing said magnified waveform to be displayed with respect to a point corresponding to one of the occurrence of said trigger signal and the occurrence of said time displaced trigger signal in accordance with a state of said switch control signal.

2. The system of claim 1, wherein the display subsystem comprises:

an acquisition circuit, coupled to the source of the input signal, for generating a sequence of samples representing the input signal;

an acquisition memory, coupled to the acquisition circuit, for storing the sample sequence; and a rasterizer, coupled to the acquisition memory, for retrieving the sample sequence from the acquisition memory and generating a signal representing a raster representing an image of the acquired input signal.

3. A method of operating a waveform display displaying system, comprising the steps of:

generating a trigger signal when a trigger event is detected in an input signal;

generating a time displaced trigger signal displaced an amount of time from the trigger signal in response to an input by a user;

setting a switch to one of a first position for operating in a first mode of operation and a second position for operating in a second mode of operation in response to a single input by a user; wherein said first mode of operation displays a waveform representing a magnified portion of the input signal in response to the trigger signal, said magnified portion of said signal including a point corresponding in time to the occurrence of said trigger signal, and said second mode of operation displays a waveform representing a second magnified portion of the input signal in response to the time displaced trigger signal, said second magnified portion of said input signal including a point corresponding in time to the occurrence of said time displaced trigger signal.

* * * * *